United States Patent [19]

Reinert

[11] 4,125,877
[45] Nov. 14, 1978

[54] DUAL PORT RANDOM ACCESS MEMORY STORAGE CELL

[75] Inventor: John R. Reinert, Mesa, Ariz.
[73] Assignee: Motorola, Inc., Schaumburg, Ill.
[21] Appl. No.: 745,023
[22] Filed: Nov. 26, 1976
[51] Int. Cl.² .................. G11C 7/00; G11C 11/40
[52] U.S. Cl. ........................... 365/190; 307/238; 307/317 A; 365/195
[58] Field of Search .......... 307/238, 289, 291, 200 A; 364/200 MS File, 900 MS File; 340/173 FF, 173 BB, 173 CC; 365/200, 190, 195, 154, 155, 156, 205

[56] References Cited

U.S. PATENT DOCUMENTS

| 2,402,758 | 6/1946 | Leverenz | 340/173 CC |
|---|---|---|---|
| 3,474,248 | 10/1969 | Brown et al. | 340/173 CC |
| 3,573,754 | 4/1971 | Merryman | 340/173 R |
| 3,609,665 | 9/1971 | Kronies | 364/200 |
| 3,665,424 | 5/1972 | Scharkowitz | 340/173 R |
| 3,676,717 | 7/1972 | Lockwood | 340/173 LI |
| 3,914,620 | 10/1975 | Millhollan et al. | 307/215 |
| 3,919,566 | 11/1975 | Millhollan et al. | 340/173 FF |
| 3,973,246 | 8/1976 | Millhollan et al. | 340/173 FF |

Primary Examiner—Bernard Konick
Assistant Examiner—Donald E. McElheny, Jr.
Attorney, Agent, or Firm—Anthony J. Sarli, Jr.

[57] ABSTRACT

A dual port memory cell suitable for use in emitter coupled logic applications is accessible from two different address ports. The dual port storage cell includes first and second cross coupled cells, each including a selection conductor and a pair of diodes coupled to the cross coupled transistors to effect selection of that storage cell. The base of each of the cross coupled transistors of the first storage cell is coupled to the base of a coupling transistor, the emitter of which is connected to the base of a corresponding transistor of the other storage cell. Each dual port memory cell has two pairs of bit lines, one pair being coupled to the first storage cell and the other being coupled to the second storage cell. If one of the storage cells is selected, and the other remains unselected, the information in the selected cell is automatically written into the unselected storage cell.

15 Claims, 3 Drawing Figures

DUAL PORT RANDOM ACCESS MEMORY STORAGE CELL

BACKGROUND OF THE INVENTION

1. Field of the Invention

The invention relates to dual port random access memory storage cells which are accessible from two different address ports.

2. Brief Description Of The Prior Art

Briefly described, random access memory cells of many varieties are well known in the art. However, such prior art cells are ordinarily addressable only from a single port. In other words, a binary address addressing a particular RAM cell causes a single select line or a coincidence of two select lines, such as a row select line and a column select line, to cause the addressed cell to be selected. Data is then sensed from or written into the selected storage cell on one or two bit sense lines. In many RAM cells, a single selection line causes the particular cell to be selected, and other selection circuitry activated by the same address causes the bit-sense lines to be selected. However, there are never any options for addressing and sensing and writing. The same selection lines and the same bit sense lines are always utilized to access and write and sense a particular location. A particular location is always represented by a single storage element. Master slave flip-flops are well known, but these are not accessible and addressable from two separate ports, and they are not bidirectional. Consequently, the storage devices of the prior art cannot be simultaneously addressed and accessed from separate sources. In certain applications especially those involving an arithmetic logic unit, this is a disadvantage.

SUMMARY OF THE INVENTION

An object of the invention is to provide a dual port random access memory cell which is addressable and accessible for reading and writing operations from two different ports.

Another object of the invention is to provide a dual port random access memory cell wherein the contents of any particular storage cell of the dual port random access memory cell are written into all other unselected storage cells of that dual port random access memory cell when that particular storage cell is selected and the others are unselected.

Briefly described, the invention is a dual port memory cell which includes a first storage cell including first means for selecting the first storage cell, and also includes first and second cross coupled transistors. The dual port memory cell also includes a second storage cell including second means for selecting the second storage cell and also includes third and fourth cross-coupled transistors. Coupling circuitry is provided for coupling the first storage cell to the second storage cell, such that whenever one of the two storage cells is selected and the other one is unselected, the data stored in the selected storage cell is also written into the unselected storage cell.

DESCRIPTION OF THE INVENTION

Figure 1:
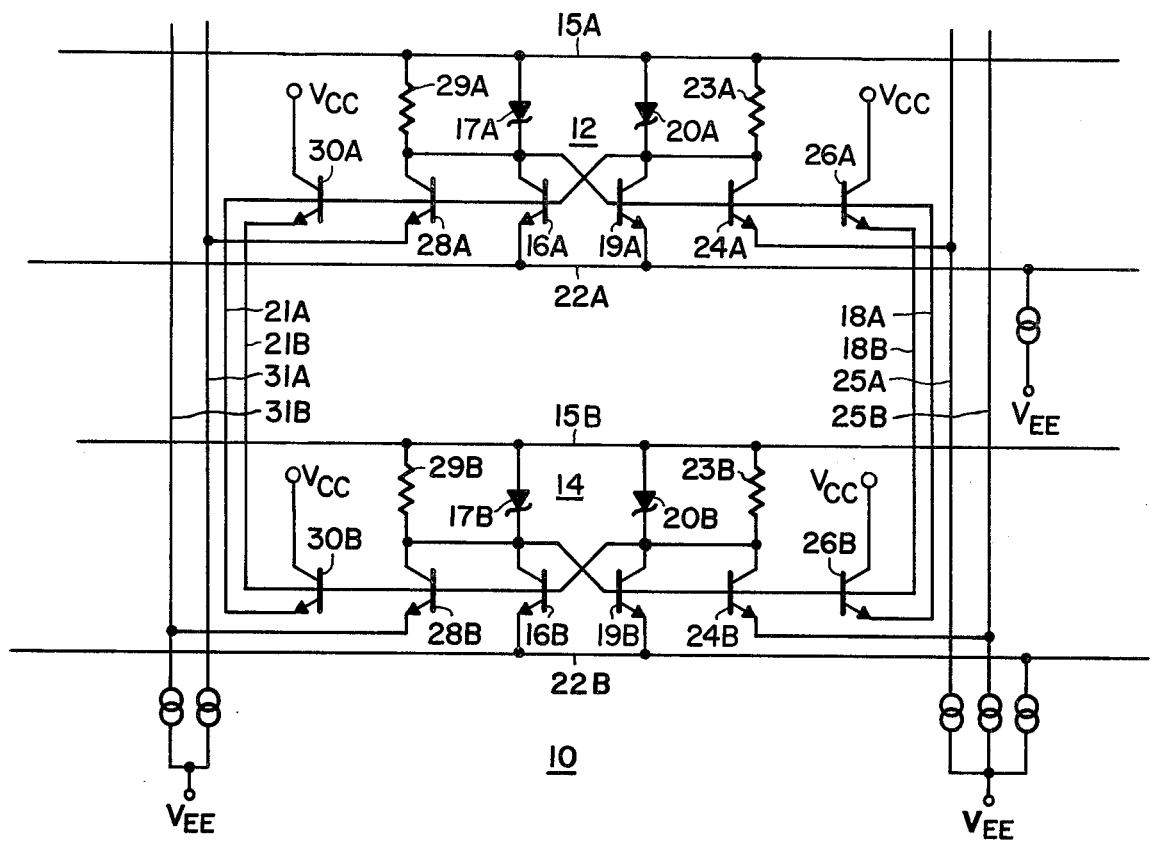
FIG. 1 is a schematic circuit diagram of a preferred embodiment of the invention.

Referring to FIG. 1, dual port random access memory storage cell 10 includes two subcells 12 and 14, and can include additional subcells arranged in the same manner as subcells 12 and 14.

Subcell 12 includes cross-coupled transistors 16A and 19A. The base of transistor 16A is cross-coupled to the collector of transistor 19A, and the base of transistor 19A is cross-coupled to the collector of transistor 16A. The emitters of transistors 16A and 19A are connected to conductor 22A, which ordinarily would be shared with a number of other similar subcells of other dual port random access memory storage cells in the same row. Conductor 22A is connected through a current source to the negative $V_{EE}$ voltage. The collector of transistor 19A, which is connected to node 21A, is also connected to the bases of transistor 28A and 30A. Similarly, the collector of transistor 16A, which is connected to node 18A, is also connected to the bases of transistors 24A and 26A. Schottky diode 17A is connected between node 18A and selection conductor 15A. Selection conductor 15A would also be connected to a number of other subcells in the same row as subcell 12. Schottky diode 20A is connected between node 21A and selection conductor 15A. Resistors 29A and 23A are connected between selection conductor 15A and nodes 18A and 21A, respectively. The emitters of transistors 28A and 24A are coupled, respectively, to bit-sense conductors 25A and 31A, which together form a bit-sense pair. The emitters of transistors 30A and 26A are connected, respectively, to conductors 21B and 18B, which provide coupling to the control or collector nodes of subcell 14, as explained hereinafter. The collectors of transistors 30A and 26A are connected to voltage conductor $V_{CC}$, although they could also be connected to selection conductor 15A. Connecting them to $V_{CC}$ rather than selection conductor 15A provides the same operation, but reduces the capacitance of selection conductor 15A, which is a desirable result.

The construction of subcell 14 is entirely similar to the construction of subcell 12, and reference numerals are similar, except that the letter B has been used instead of the letter A to identify corresponding parts. The emitters of transistors 28B and 24B, however, are coupled to bit-sense conductors 31B and 25B, which constitute a second bit-sense pair. Subcell 14 has a separate selection conductor 15B and a separate conductor 22B, both of which are shared with other subcells in the same row, not shown. Each of the bit-sense conductors is terminated by means of a current source coupled to $V_{EE}$. The emitters of transistors 30B and 26B are coupled, respectively, to nodes 21A and 18A.

As mentioned earlier, a dual port memory is one in which memory locations are accessible from two different address ports. It is desirable that the dual port capability extend both to read operations and write operations independently of each other, so that the location can be read independently from both ports, and also be written independently from both ports. Selection, sensing, and writing of cells such as the subcells 12 and 14, without the transistors 30A and 26A (or 30B and 26B) is well known in the art. For example, see U.S. Pat. No. 3,919,566, by Millhollan et al., assigned to the present assignee, and incorporated by reference herein. Also see U.S. Pat. No. 3,914,620, also by Millhollan et al., assigned to the present assignee and also incorporated by reference herein. Selection of one of the subcells is accomplished by raising the associated selection conductor to a "high" state. Writing of the subcell is effected by forcing bit line conditions which in turn force the selected subcell to the desired state.

The dual port arrangement is obtained by symmetrical mutual coupling of the two single port storage cells comprising a dual port random access memory location. This symmetrical mutual coupling is accomplished by the transistors 30A, 26A, 30B, and 26B so that the emitters of 30A and 26A are coupled to the collector nodes of subcell 14, and emitters of 30B and 26B are coupled to the collector nodes of subcell 12.

The operative electrical coupling is achieved when the dual port memory location is accessed or addressed from either port, i.e., by either raising selection conductor 15A high or by raising selection conductor 15B high. If the voltage of the selection conductor is raised more than one $V_{BE}$ voltage drop above its nonselected level, the emitter follower coupling transistors (i.e., 30A and 26A) are turned on and couple the selected subcell collector node voltages (i.e., 21A and 18A) to the corresponding collector nodes in the unselected subcells associated with the other port or ports. For example, if subcell 12 is selected, as indicated above, and transistors 28A and 16A are on, then transistor 30A forces the base of transistors 28B and 16B high, thereby turning on transistors 28B and 16B, which in turn pulls node 18B low, turning transistors 19B and 24B off. Since the selection voltage of subcell 12 is at a higher voltage than selection conductor 15B, the coupling transistors 30B and 26B are off, and the information transfer coupling is unidirectional, from subcell 12 to subcell 14, but not vice versa. Transfer of information from one subcell to the other occurs only if one selection conductor is high and the other is low. The following table indicates the operation.

| SELECTION CONDUCTOR 15A | SELECTION CONDUCTOR 15B | TRANSFER |
|---|---|---|
| Low | Low | No Transfer |
| Low | High | Subcell 14 → Subcell 12 |
| High | Low | Subcell 12 → Subcell 14 |
| High | High | No Transfer |

Note that even if a dual port random access memory cell is selected from both ports, i.e., both selection conductors 15A and 15B are high, action from one port cannot interfere with the other port, and the desired independence is achieved. If a write operation occurs from both ports, final storage information can be controlled by selectively removing one address prior to the other. The contents of any selected subcell are written automatically into all other unselected subcells of the particular dual port random access memory cell.

A typical value for $V_{CC}$ would be zero volts, and for $V_{EE}$ a typical value would be $-5.2$ volts. Typical voltages for the select lines would be $-1.0$ volts for the select voltage and $-2.0$ volts for the unselected voltage. The current sources on conductors 22A and 22B would typically be 40 microamps. The typical forward voltage of the Schottky diodes such as 17A and 20A, are approximately 0.5 volts. Then, the on side of an unselected storage cell would be at approximately $-2.5$ volts, and the Schottky diode of the opposite side of the cell will be off. The bit-sense conductors connected to that subcell are biased such that the output transistors, such as 28A and 24A, would be off while the subcell is unselected. When the subcell is selected, and the selection conductor goes from $-2.0$ volts to $-1.0$ volts, the collector node of the on side rises from $-2.5$ volts to $-1.5$ volts, turning on the output transistor on the on side of the storage cell, since the sense amplifier devices (not shown) coupled to the bit-sense conductors are both biased at approximately $-1.25$ volts (the midpoint of the storage cell collector voltage swing). However, no additional current flows from a cell to the bit-sense conductor on the off side of the subcell. Therefore the current in the current source at the end of that bit-sense line is all supplied by the sense amp. However, on the on side of the storage cell, the extra current flowing from the storage cell into the bit-sense conductor reduces the amount of current supplied by the sense amp, causing the sense amplifier output to increase. For a more detailed description of the sensing and writing operations, see the above cited patents, which were incorporated herein by reference. Another sense amplifier that could be used with the present invention is of the type described in co-pending application No. 745,021 filed Nov. 26, 1976, and entitled "Sense-Write Circuit For Random Access Memory" and assigned to the assignee of the present invention.

Figure 2:
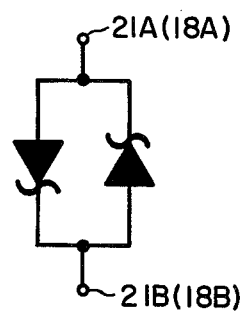
FIG. 2 is a schematic drawing representing a modification which can be made to the embodiment of FIG. 1.

FIG. 2 discloses a circuit consisting of two Schottky diodes connected in reverse parallel configurations. By eliminating transistor 26A and transistor 26B and connecting a circuit such as shown in FIG. 2 between the collector nodes 18A and 18B and providing another circuit such as the one shown in FIG. 2 between collector nodes 21A and 21B, and also eliminating transistors 30A and 30B, an operable alternative dual port random access memory cell could be provided. However, it has the disadvantage that the current for transferring information from the selected subcell to the unselected subcell needs to be supplied by the selected subcell, whereas in the embodiment of FIG. 1, most of the current required for the information transfer comes from $V_{CC}$.

Figure 3:
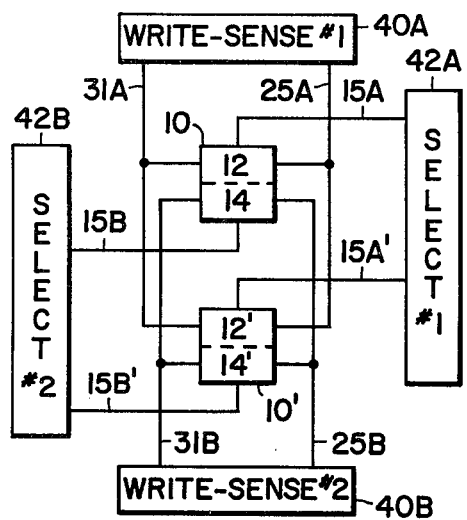
FIG. 3 is a block diagram of a dual port memory circuit which employs a plurality of memory cells of the type shown in FIG. 1.

In FIG. 3 a dual port memory circuit is shown which employs a plurality of memory cells of the type already described in association with FIG. 1. Dual port memory cells 10 and 10' are each composed of two subcells (12, 14, and 12', 14', respectively). Although only two dual port memory cells have been shown in FIG. 3 it will be obvious to one skilled in the art that additional dual port memory cells can be provided. Subcell 12 is selected by selection conductor 15A as was described earlier. Subcell 12' is selected by selection conductor 15A'. The voltages of selection conductors 15A and 15A' are determined by selection block 42A. The details of selection block 42A are described by Millhollan et al, U.S. Pat. No. 3,914,620, which has been incorporated by reference. Similarly, subcells 14 and 14' are selected by selection conductors 15B and 15B' respectively, which are coupled to selection block 42B, which is similar to selection block 42A.

Subcells 12 and 12' are coupled to bit sense conductors 31A and 25A which are coupled to write-sense block 40A. As the writing and sensing of the subcells has already been described, the description will not be repeated here. In a like manner subcells 14 and 14' are coupled to bit sense conductors 31B and 25B which are coupled to write-sense block 40B, which is similar to write-sense block 40A. One of the unique features of the dual port memory cell is that it allows write-sense block 40A and write-sense block 40B to function simultaneously yet independently of each other. For example, data may be written into dual port memory cells 10 and 10' simultaneously. One possibility is to have selection block 42A select dual port memory cell 10 by allowing selection conductor 15A to be at a high voltage while keeping selection conductor 15A' at a low voltage. Write-sense block 40A can then write data into subcell 12. At the same time, selection block 42B can select dual port memory cell 10' by allowing selection conductor 15B' to seek a high voltage while keeping selection conductor 15B at a low voltage. Write-sense block 40B can then be used to write data into subcell 14'. As was earlier described, the operation of the dual port memory cell causes the data written in subcell 12 to be transferred to subcell 14 and likewise causes the data written into subcell 14' to be transferred to subcell 12'. Due to the subcell data transfer which occurs within each of the dual port memory cells, it is then entirely possible during the next succeeding memory operation to sense the data stored in dual port memory cell 10 by using write-sense block 40B and to sense the data stored in dual port memory cell 10' by using write-sense block 40A. It should be obvious that it is also possible to write data in dual port memory cell 10 using write-sense block 40A while sensing the data stored in dual port memory cell 10' using write-sense block 40B, or vice versa.

What is claimed is:

1. A dual port memory cell comprising:
    a first storage cell having first and second cross-coupled switching means;
    first selecting means coupled to said first and second switching means for effecting selection of said first storage cell;
    a second storage cell having third and fourth cross-coupled switching means;
    second selection means coupled to said third and fourth switching means for effecting selection of said second storage cell;
    first unidirectional means responsive to a control electrode of said first switching means coupled to a corresponding control electrode of said third switching means for causing said third switching means to be switched on if said first switching means is on, said first storage cell is selected, and said second storage cell is unselected.

2. A dual port memory cell comprising:
    (a) a first storage cell including first and second cross-coupled transistors,
    (b) first selection means coupled to said first storage cell for selecting said first storage cell,
    (c) a second storage cell including third and fourth cross-coupled transistors,
    (d) second selection means coupled to said second storage cell for selecting said second storage cell, and
    (e) coupling means responsive to said first and second selection means for coupling said first storage cell to said second storage cell and for causing a state stored in a selected one of said storage cells to be also stored in an unselected other of said storage cells, said coupling means including first, second, third, and fourth coupling transistors, said first and second coupling transistor each having its base coupled to the base of said first and second cross-coupled transistor, respectively, and its emitter coupled to the base of said third and fourth cross-coupled transistor, respectively, and said third and fourth coupling transistor each having its base coupled to the base of said third and fourth cross-coupled transistor, respectively, and its emitter coupled to the base of said first and second cross-coupled transistors, respectively.

3. A dual port memory cell comprising:
    (a) a first storage cell including first and second cross-coupled transistors,
    (b) first selection means coupled to said first storage cell for selecting said first storage cell,
    (c) a second storage cell including third and fourth cross-coupled transistors,
    (d) second selection means coupled to said second storage cell for selecting said second storage cell, and
    (e) coupling means responsive to said first and second selection means for coupling said first storage cell to said second storage cell and for causing a state stored in a selected one of said storage cells to be also stored in an unselected other of said storage cell, said coupling means including a first pair of reverse parallel coupled diodes coupled between the collectors of said first and third cross-coupled transistors and also including a second pair of reverse parallel coupled diodes coupled between the collectors of said second and fourth cross-coupled transistors.

4. The dual port memory cell as recited in claim 3 wherein said diodes are Schottky barrier diodes.

5. A dual port memory circuit for storing digital data comprising:
    (a) a plurality of memory cells, each of said memory cells including switching transistor means for storing a binary logic state,
    (b) first write-sense means coupled to said plurality of memory cells for writing digital data into said sensing digital data from each of said plurality of memory cells,
    (c) second write-sense means coupled to said plurality of memory cells for writing digital data into and sensing digital data from each of said plurality of memory cells, and
    (d) said first and second write-sense means being simultaneously operative for writing signal data into and sensing digital data from said plurality of memory cells.

6. A dual port memory circuit for storing digital data as recited in claim 5 wherein:
    (a) a first of said plurality of memory cells is written or sensed by said first write-sense means at the same time that a second of said plurality of memory cells is written or sensed by said second write-sense means.

7. A dual port memory circuit for storing digital data as recited in claim 5 further comprising:
    (a) first selection means coupled to said plurality of memory cells for selecting a first of said plurality of memory cells to be written or sensed by said first write-sense means,
    (b) second selection means coupled to said plurality of memory cells for selecting a second of said plurality of memory cells to be written or sensed by said second write-sense means.

8. A dual port memory circuit for storing digital data comprising:

(a) a plurality of memory cells, each of said plurality of memory cells including a first and second storage cell and including coupling means for coupling said first storage cell to said second storage cell and for providing a transfer of digital data between said first and second storage cells, (b) first write-sense means coupled to said plurality of memory cells for writing digital data into and sensing digital data from any one of said plurality of memory cells, (c) second write-sense means coupled to said plurality of memory cells for writing digital data into and sensing digital data from any one of said plurality of memory cells, and (d) first and second write-sense means being simultaneously operative for writing digital data into and sensing digital data from said plurality of memory cells.

9. A dual port memory circuit as recited in claim 8 further comprising:

(a) first selection means coupled to each first storage cell of each of said plurality of memory cells for selecting one of said first storage cells to be written or sensed by said first write-sense means, and (b) second selection means coupled to each second storage cell of each of said plurality of memory cells for selecting one of said second storage cells to be written or sensed by said second write-sense means.

10. A dual port memory circuit as recited in claim 9 wherein:

(a) said coupling means is responsive to said first and second selection means for coupling said first storage cell to said second storage cell and for causing digital data stored in a selected one of said storage cells to be also stored in an unselected other of said storage cells.

11. A dual port memory cell comprising:

a first storage cell, including first selection means for selecting first storage cell and including first coupling means responsive to said first selection means for coupling said first storage cell to read-write circuitry when said first storage cell is selected;

a second storage cell, including second selection means for selecting said second storage cell and including second coupling means responsive to said second selection means for coupling said second storage cell to read-write circuitry when said second storage cell is selected;

third coupling means responsive to said first and second selection means for coupling said first storage cell to said second storage cell and for causing a state stored in a selected one of said storage cells to be also stored in an unselected other of said storage cells.

12. The dual port memory cell as recited in claim 11 wherein said first storage cell comprises first and second cross coupled transistors, and said second storage cell comprises third and fourth cross coupled transistors.

13. The dual port memory cell as recited in claim 12 wherein each of said storage cells include a Schottky diode and a resistor coupled in parallel between the collector of each of said cross-coupled transistors and its corresponding selection means.

14. The dual port memory cell as recited in claim 12 wherein each of said storage cells include first and second output transistors each having a base coupled, respectively, to a base of one of said cross-coupled transistors and each having its collector coupled, respectively, to the collector of one of said cross-coupled transistors, and each having its emitter coupled, respectively, to a separate bit-sense conductor.

15. The dual port memory cell as recited in claim 14 wherein each of said storage cells comprises a Schottky diode and a resistor coupled in parallel between the collector of each of said cross coupled transistors and corresponding selection means.

* * * * *